(12) United States Patent
Otsuka et al.

(10) Patent No.: US 11,222,991 B2
(45) Date of Patent: *Jan. 11, 2022

(54) SOLAR CELL AND METHOD FOR MANUFACTURING THE SAME

(71) Applicant: SHIN-ETSU CHEMICAL CO., LTD., Tokyo (JP)

(72) Inventors: Hiroyuki Otsuka, Karuizawa-machi (JP); Takenori Watabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,349

(22) Filed: Feb. 7, 2020

(65) Prior Publication Data

US 2020/0176626 A1 Jun. 4, 2020

Related U.S. Application Data

(63) Continuation of application No. 16/745,856, filed on Jan. 17, 2020, now abandoned, which is a (Continued)

(51) Int. Cl.
*H01L 31/068* (2012.01)
*H01L 31/0352* (2006.01)
(Continued)

(52) U.S. Cl.
CPC ........ *H01L 31/068* (2013.01); *H01L 31/0288* (2013.01); *H01L 31/036* (2013.01); *H01L 31/0392* (2013.01); *H01L 31/035272* (2013.01); *H01L 31/18* (2013.01); *H01L 31/1804* (2013.01); *Y02E 10/547* (2013.01); *Y02P 70/50* (2015.11)

(58) Field of Classification Search
None
See application file for complete search history.

(56) References Cited

U.S. PATENT DOCUMENTS 6,815,605 B1 11/2004 Abe et al.
2005/0252544 A1 11/2005 Rohatgi et al.
(Continued)

FOREIGN PATENT DOCUMENTS

CN 101971358 A 2/2011
CN 102598308 A 7/2012
(Continued)

OTHER PUBLICATIONS

Apr. 30, 2020 U.S. Office Action issued U.S. Appl. No. 15/522,636.
(Continued)

*Primary Examiner* — Dustin Q Dam
(74) *Attorney, Agent, or Firm* — Oliff PLC

(57) ABSTRACT

A solar cell has a P-type silicon substrate in which one main surface is a light-receiving surface and another main surface is a backside, a dielectric film on the backside, and an N-conductivity type layer in at least a part of the light-receiving surface of the P-type silicon substrate. The P-type silicon substrate is a silicon substrate doped with gallium, and the backside of the P-type silicon substrate contains a diffused group III element.

14 Claims, 3 Drawing Sheets

Related U.S. Application Data continuation of application No. 15/522,636, filed as application No. PCT/JP2015/005166 on Oct. 13, 2015.

(51) Int. Cl.
*H01L 31/18* (2006.01)
*H01L 31/0288* (2006.01)
*H01L 31/036* (2006.01)
*H01L 31/0392* (2006.01)

(56) References Cited

U.S. PATENT DOCUMENTS

| | | |
|---|---|---|
| 2006/0255340 A1 | 11/2006 | Manivannan et al. |
| 2007/0186970 A1 | 8/2007 | Takahashi et al. |
| 2009/0020156 A1 | 1/2009 | Ohtsuka et al. |
| 2010/0084009 A1 | 4/2010 | Carlson et al. |
| 2010/0173447 A1 | 7/2010 | Takahashi et al. |
| 2011/0020976 A1 | 1/2011 | Watai et al. |
| 2012/0174960 A1 | 7/2012 | Hashigami et al. |
| 2013/0255765 A1* | 10/2013 | Gee ................. H01L 31/032 136/256 |
| 2015/0214391 A1* | 7/2015 | Hattori ............. H01L 31/02167 136/256 |
| 2016/0072003 A1 | 3/2016 | Kohata |

FOREIGN PATENT DOCUMENTS

| | | |
|---|---|---|
| EP | 2 270 841 A1 | 1/2011 |
| JP | S52-002389 A | 1/1977 |
| JP | H6-310740 A | 11/1994 |
| JP | H10-190033 A | 7/1998 |
| JP | 2002-047095 A | 2/2002 |
| JP | 2002-076400 A | 3/2002 |
| JP | 2002-083983 A | 3/2002 |
| JP | 2004-064028 A | 2/2004 |
| JP | 2004-193337 A | 7/2004 |
| JP | 2004-335867 A | 11/2004 |
| JP | 2005-079143 A | 3/2005 |
| JP | 2005-116783 A | 4/2005 |
| JP | 2006-093433 A | 4/2006 |
| JP | 2006-310368 A | 11/2006 |
| JP | 2006-319335 A | 11/2006 |
| JP | 2007-266328 A | 10/2007 |
| JP | 2007-294494 A | 11/2007 |
| JP | 2010-052184 A | 3/2010 |
| JP | 2010067920 A | 3/2010 |
| JP | 2010-521824 A | 6/2010 |
| JP | 2010-186900 A | 8/2010 |
| JP | 2011-240623 A | 12/2011 |
| JP | 2012-033758 A | 2/2012 |
| JP | 2012-049424 A | 3/2012 |
| JP | 2013-115258 A | 6/2013 |
| JP | 2014-007284 A | 1/2014 |
| JP | 2014-146766 A | 8/2014 |
| WO | 00/73542 A1 | 12/2000 |
| WO | 2011033826 A1 | 3/2011 |
| WO | 2014/174613 A1 | 10/2014 |

OTHER PUBLICATIONS

Dec. 15, 2015 Search Report issued in International Patent Application No. PCT/JP2015/005166.
Apr. 18, 2017 Office Action issued in Japanese Patent Application No. 2014-225613.
May 9, 2017 International Preliminary Report on Patentability issued in International Patent Application No. PCT/JP2015/005166.
Jun. 27, 2017 Office Action issued in Japanese Patent Application No. 2014-225613.
May 4, 2018 Office Action issued in Chinese Application No. 201580060359.0.
Jul. 13, 2018 Office Action Issued in U.S. Appl. No. 15/522,636.
Jun. 19, 2018 Search Report issued in European Patent Application No. 15857438.4.
Jul. 17, 2018 Office Action issued in Japanese Application No. 2014-225613.
Sep. 25, 2018 Office Action issued in Japanese Application No. 2014-225613.
Dec. 14, 2019 Office Action issued in Chinese Application No. 201580060359.0.
Jan. 22, 2019 Decision issued in Japanese Application No. 2014-225613.
Jan. 22, 2019 Office Action issued in Japanese Application No. 2014-225613.
Mar. 29, 2019 Office Action issued in Chinese Application No. 201580060359.0.
Jun. 17, 2019 Office Action Issued for U.S. Appl. No. 15/522,636.
Dec. 12, 2019 U.S. Office Action issued U.S. Appl. No. 15/522,636.
Wan et al; "Evidence 1: Principle of Power Transistor;" Textbook, ISBN 978-7-491-9/TN.24; Mar. 2009.
Nov. 27, 2019 Office Action issued in Chinese Patent Application No. 201580060359.0.
An et al; "Evidence 2: Principle of Solar Cell and Technology;" Textbook; Shanghai Science and Technology Press; Oct. 1984.
Apr. 24, 2020 Office Action issued in Chinese Patent Application No. 201580060359.
Oct. 28, 2020 Office Action Issued in U.S. Appl. No. 15/522,636.
Apr. 9, 2021 Office Action issued in European Patent Application No. 15857438.4.

* cited by examiner

SOLAR CELL AND METHOD FOR MANUFACTURING THE SAME

This is a Continuation of application Ser. No. 16/745,856 filed Jan. 17, 2020, which in turn is a Continuation of application Ser. No. 15/522,636 filed Apr. 27, 2017, which in turn is a national stage of PCT/JP2015/005166 filed Oct. 13, 2015, which claims priority to JP 2014-225613 filed Nov. 5, 2014. The disclosure of the prior applications is hereby incorporated by reference herein in its entirety.

TECHNICAL FIELD

The present invention relates to a solar cell and a method for manufacturing the same.

BACKGROUND ART

Semiconductor substrates for solar cells are usually manufactured by a Czochralski method (CZ method), which can produce a single crystal with a large-diameter at relatively low cost. For example, P-type semiconductor substrates can be obtained by drawing a silicon single crystal doped with boron by a CZ method, and slicing this single crystal. Thus obtained silicon substrates doped with boron, being irradiated with strong sunlight, cause decrease in the lifetime under the influence of boron and oxygen in the substrate. As a result, the light induced degradation comes to being.

In order to solve such light induced degradation issue, Patent Literature 1 proposes the use of gallium instead of boron as P-type dopant.

As a backside structure of solar cells, a structure having a Back Surface Field (BSF) region can be illustrated. The BSF region can be applied to the almost whole surface of the backside by printing an aluminum paste to the almost whole surface of the backside of a substrate and firing thereof.

Other structures include a structure which has local contacts between the substrate and a back surface electrode and is protected by a dielectric film on the most of the back surface, which acts as a passivation layer, in order to further improve the efficiency. These solar cell structures are referred to as a Passivated Emitter and Rear Contact Solar Cell (PERC) structure and a Passivated Emitter and Rear Locally Diffused Solar Cell (PERL) structure.

The cross section of the solar cell having a previous PERL structure is schematically shown in FIG. 6. As shown in FIG. 6, the solar cell 110 is provided with the N-conductivity type layer (emitter layer) 112 on the side of the light-receiving surface of the P-type silicon substrate 111, and the light-receiving surface electrode 116 on this N-conductivity type layer 112. In many cases, the solar cells each have the anti-reflection film 114 on the light-receiving surface. The solar cell is also provided with the dielectric film 115, which acts as a passivation film or a protective film, on the back surface; the back surface electrode 117 on the back surface; and the BSF layer 113 at the contact area where the back surface electrode 117 is in contact with the P-type silicon substrate 111.

CITATION LIST

Patent Literature

Patent Literature 1: pamphlet of International Patent Laid-Open Publication No. WO 2000/073542

SUMMARY OF INVENTION

Technical Problem

In manufacturing of the foregoing solar cells having the PERC structure and the PERL structure, etc., the formation of a dielectric film on the backside, particularly when using a silicon substrate doped with gallium (hereinafter, referred to as a "gallium-doped substrate"), causes diffusion of the doped gallium atom(s) to the side of the dielectric film to decrease the surface concentration of gallium (P-type dopant) in the backside of the substrate.

Such decrease in the surface concentration of gallium in the backside of the substrate causes i) an increase in the contact resistance; ii) formation of the inversion layer 118 in the backside of the substrate as shown in FIG. 6 when forming a dielectric film having positive charge, thereby generating leak current near the contact (contact area) to seriously degrade the characteristics of the solar cell.

The present invention was accomplished in view of the above-described problems. It is an object of the present invention to provide a solar cell with excellent conversion efficiency provided with a gallium-doped substrate, and a method for manufacturing the same.

Solution to Problem

To achieve the above-described object, the present invention provides a solar cell comprising a P-type silicon substrate in which one main surface is a light-receiving surface and another main surface is a backside, a dielectric film on the backside, and an N-conductivity type layer in at least a part of the light-receiving surface of the P-type silicon substrate, wherein the P-type silicon substrate is a silicon substrate doped with gallium, and the backside of the P-type silicon substrate contains a diffused group III element.

Such a solar cell, containing a group III element diffused in the backside of the substrate, has sufficient concentration of P-type dopant in the backside of the substrate even when a dielectric film is formed on the backside of a gallium-doped substrate. This can be a solar cell having high conversion efficiency that can prevent an increase in the contact resistance and generation of leak current near the contact.

It is preferable that the diffusion surface concentration of the group III element in the backside be $5.0 \times 10^{17}$ atom/cm$^3$ or more and $2.0 \times 10^{19}$ atom/cm$^3$ or less.

In the solar cell having such a concentration of a group III element being diffused in the backside, degradation of the cell characteristics can be reduced while eliminating the decrease in the concentration of a P-type dopant in the backside.

It is also preferable that the group III element be boron, gallium, or aluminum.

These are particularly suitable elements contained in the backside of the substrate of the inventive solar cell.

The present invention also provides a method for manufacturing a solar cell having a P-type silicon substrate in which one main surface is a light-receiving surface and another main surface is a backside, comprising the steps of:

preparing a silicon substrate uniformly doped with gallium as the P-type silicon substrate, diffusing a group III element to the backside, forming an N-conductivity type layer in the light-receiving surface, and forming a dielectric film on the backside.

Such a method for manufacturing a solar cell can introduce a P⁻ layer in which a group III element is diffused in the backside. Accordingly, even when a dielectric film is formed on the backside of a gallium-doped substrate as a passivation film and so on, the amount of the P-type dopant is compensated, which makes it possible to prevent decrease in the P-type dopant concentration near the backside surface of the substrate in contact with the dielectric film. As a result, it is possible to avoid drop in the voltage due to leak current to keep the high efficiency.

It is also preferable that the step of diffusing a group III element and the step of forming an N-conductivity type layer be performed in one thermal treatment.

Such a method for manufacturing a solar cell can easily form a layer which contains a group III element at low cost.

Advantageous Effects of Invention

The inventive solar cell contains a group III element diffused in the backside of the substrate, thereby having sufficient P-type dopant concentration in the backside of the substrate even when a dielectric film is formed on the backside of the gallium-doped substrate. The inventive method for manufacturing a solar cell introduces a group III element such as boron to the backside to compensate the amount of P-type dopant, which makes it possible to prevent decrease in the P-type dopant concentration, even when a dielectric film is formed on the backside of a gallium-doped substrate as a passivation film and so on, in the vicinity of the backside surface of the substrate in contact with the dielectric film. As a result, it is possible to avoid drop in the voltage due to leak current to keep the high efficiency.

DESCRIPTION OF EMBODIMENTS

Hereinafter, the present invention will be more specifically described.

As described above, a solar cell with excellent conversion efficiency provided with a gallium-doped substrate and a method for manufacturing the solar cell has been demanded. However, when the gallium-doped substrate is used as a substrate for a solar cell, and a dielectric film is formed on the surface of the substrate as a protective film or a passivation film, the amount of gallium, which is dopant, is decreased at an area being in contact with the dielectric film and in the vicinity thereof as described above.

The inventors have diligently investigated to solve the problems. As a result, the inventors have found that a solar cell having a gallium-doped substrate and a dielectric film on the backside, and containing a group III element diffused in the backside of this substrate can solve the foregoing problems; thereby brought the inventive solar cell and the method for manufacturing the same to completion.

Hereinafter, an embodiment of the present invention will be specifically described with reference to FIGS, but the present invention is not limited thereto.

Figure 1:
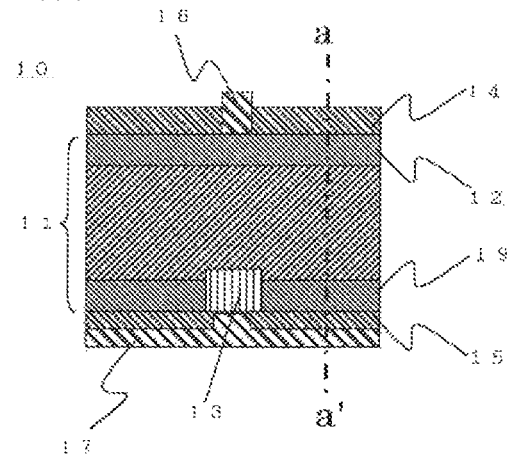
FIG. 1 is a sectional view showing an example of the inventive solar cell.

FIG. 1 is a sectional view showing an example of the inventive solar cell. As shown in FIG. 1, the inventive solar cell 10 is provided with the P-type silicon substrate 11 in which one of the main surface is a light-receiving surface and another main surface is a backside. This P-type silicon substrate 11 is a gallium-doped silicon substrate provided with the dielectric film (backside dielectric film) 15 on the backside. The P-type silicon substrate 11 also has the N-conductivity type layer 12 in at least a part of the light-receiving surface.

The resistivity of the gallium-doped P-type silicon substrate 11 is not particularly restricted, but it can be in a range of 0.1 to 5 Ω·cm, for example. The thickness of the P-type silicon substrate 11 is not particularly restricted, and can be a thickness of 100 to 200 μm, for example. The shape and area of the main surface of the P-type silicon substrate 11 is not particularly restricted.

As shown in FIG. 1, the backside is generally provided with the back surface electrode 17 thereon. The back surface electrode 17 can be joined to the backside of the P-type silicon substrate 11 by locally opening the backside dielectric film 15 as shown in FIG. 1. The N-conductivity type layer 12 is generally provided with the light-receiving surface electrode 16 thereon. The light-receiving surface can also be provided with the light-receiving surface dielectric film 14, which acts as an anti-reflection film, etc. On the contact area where the back surface electrode 17 is in contact with the P-type silicon substrate 11, the BSF layer 13 can be installed. In this case, the solar cell has a PERL structure. It is also possible to form a solar cell having a PERC structure without providing the BSF layer 13.

Herein, the solar cell having a PERC structure means a solar cell provided with a surface passivation layer formed on the backside of the substrate, and having local contact areas where the P-type silicon substrate is in contact with the back surface electrode. The solar cell having a PERL structure means a solar cell where the P-type dopant concentration on the contact areas is higher than that on areas other than the contact area. In these cases, the area where the back surface electrode 17 is in direct contact with the P-type silicon substrate 11 may have a pitch of 1 mm or more and 10 mm or less, for example.

As described above, the dielectric film on the light-receiving surface can act as an anti-reflection film. The dielectric film on the light-receiving surface can also act as a passivation film or a protective film. The dielectric film on the backside can act as a passivation film or a protective film. For these dielectric films, it is possible to use an SiNx film (a silicon nitride film), an $SiO_2$ film, etc., which can be formed by using a plasma CVD equipment; it is also possible to use a thermal oxide film. As the anti-reflection film, a dielectric film with the film thickness of 85 to 105 nm is suitable, showing the maximum effect to reduce the reflectance.

In the present invention, the P-type silicon substrate 11 is a silicon substrate doped with gallium. A group III element (an element of group 13) is diffused on the backside of the P-type silicon substrate 11. In FIG. 1, the layer in which a group III element is diffused is shown by the reference number 19.

Illustrative examples of the N-type dopant contained in the N-conductivity type layer 12 include P (phosphorus), Sb (antimony), As (arsenic), and Bi (bismuth). Illustrative examples of the diffused group III element include B (boron), Ga (gallium), Al (aluminum), and In (indium). The group III element is preferably boron, gallium, or aluminum.

The diffused surface concentration of the group III element on the backside is not particularly restricted. The diffused surface concentration can be $1.0 \times 10^{15}$ atom/cm$^3$ or more and $1.0 \times 10^{20}$ atom/cm$^3$ or less, for example. It is preferably $5.0 \times 10^{17}$ atom/cm$^3$ or more and $2.0 \times 10^{19}$ atom/cm$^3$ or less. The diffusion surface concentration of $5.0 \times 10^{17}$ atom/cm$^3$ or more can sufficiently eliminate depletion of the P-type dopant concentration in the backside. The diffusion surface concentration of $2.0 \times 10^{19}$ atom/cm$^3$ or less can eliminate degradation of the cell characteristics without decrease in the voltage and the conversion efficiency. Herein, the diffused surface concentration means a concentration of the group III element on the backside which is additionally doped, and does not include a concentration of gallium that is originally contained. This condition of the diffused surface concentration may be satisfied in the prescribed thickness at the side of back surface. The prescribed thickness can be 0.1 μm. It is preferable to meet this prescription to the depth of 0.5 μm.

The diffusion depth of the group III element in the backside is not particularly restricted. The diffusion depth can be in a range of 0.1 μm to 3 μm, for example.

The area for diffusing the group III element is not particularly restricted. It is desirable, however, to diffuse the group III element over the whole area of the backside in order to sufficiently eliminate depletion of the P-type dopant concentration in the backside.

The concentration of N-type dopant in the N-conductivity type layer 12 is not particularly restricted. This concentration can be $1.0 \times 10^{18}$ atom/cm$^3$ or more and $1.0 \times 10^{20}$ atom/cm$^3$ or less, for example. The N-conductivity type layer 12 can be formed on the whole area of the light-receiving surface. The shape of the N-conductivity type layer 12 can be appropriately altered in accordance with a shape of the light-receiving surface electrode 16.

Figure 2:
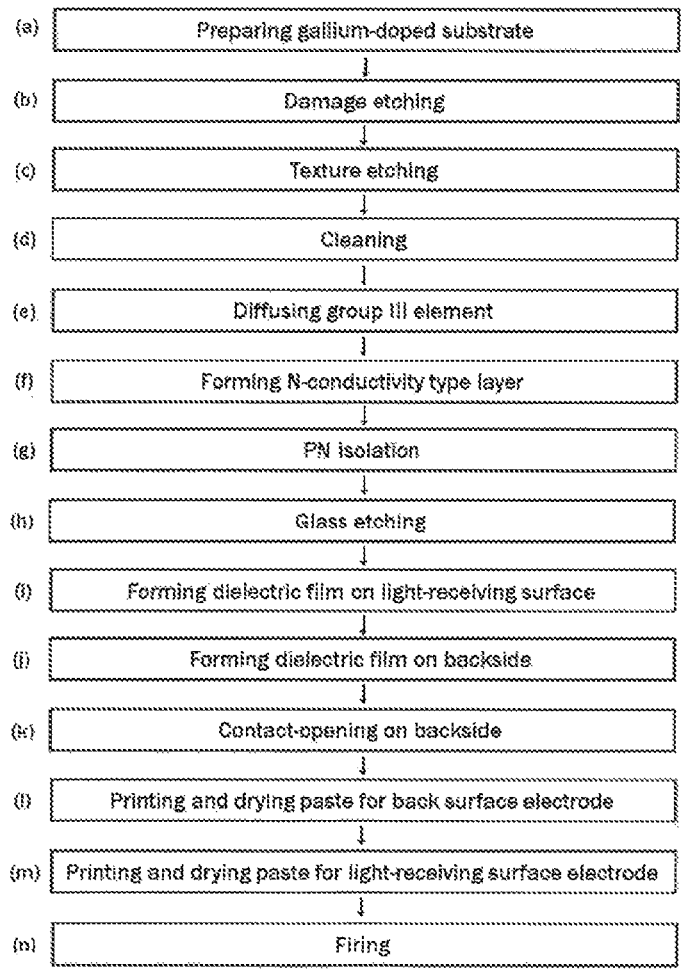
FIG. 2 is a flow diagram showing an example of the inventive method for manufacturing a solar cell.

Then, the inventive method for manufacturing a solar cell is described with reference to FIG. 2. FIG. 2 is a flow diagram showing an example of the inventive method for manufacturing a solar cell. The method described below is a typical example, and the present invention is not restricted thereto. First, as shown in FIG. 2 (a), a silicon substrate uniformly doped with gallium is prepared for the P-type silicon substrate in which one main surface is a light-receiving surface and another main surface is a backside. It is to be noted that the silicon substrate uniformly doped with gallium means a silicon substrate that is doped with gallium of a P-type dopant uniformly over the whole region of the substrate (in the thickness direction and the length direction) such as a substrate sliced from a silicon single crystal grown by a CZ method. It may have a slight inhomogeneous concentration distribution that is not intentionally caused by segregation, etc.

The silicon single crystal from which the gallium-doped substrate is sliced can be produced by a CZ method, for example, as described above. In this case, gallium and a polycrystalline silicon may be introduced into a crucible in a lump to form a raw material melt. It is desirable to produce dopant by pulverizing a silicon single crystal doped with higher concentration of gallium, and then to adjust the concentration by introducing the dopant into melted polycrystalline silicon so as to have a desired concentration, since it is necessary to precisely adjust the concentration, particularly in mass production. The gallium-doped substrate can be obtained by slicing thus obtained gallium-doped silicon single crystal.

Subsequently, slice damages on the surface of the substrate can be removed by etching with a high-concentration alkaline solution such as sodium hydroxide and potassium hydroxide in a concentration of 5 to 60%, or mixed acid of hydrofluoric acid and nitric acid, etc. as shown in FIG. 2 (b).

Then, the substrate surface can be processed to form micro-roughness called texture as shown in FIG. 2 (c). The texture is an effective method to reduce the reflectance of a solar cell. The texture can be produced by immersing the substrate in heated alkaline solution (concentration: 1 to 10%, temperature: 60 to 100° C.) such as sodium hydroxide, potassium hydroxide, potassium carbonate, sodium carbonate, and sodium hydrogencarbonate for about 10 minutes to 30 minutes. In order to form the texture uniformly over the surface, a certain amount of 2-propanol (IPA: isopropyl alcohol) is commonly added to the foregoing solution.

After the damage-etching and texture formation, it is preferable to wash the substrate as shown in FIG. 2 (d). The cleaning can be performed by using an aqueous acid solution of hydrochloric acid, sulfuric acid, nitric acid, hydrofluoric acid, or mixed solvent thereof; or pure water, for example.

Subsequently, a group III element is diffused to the backside of the gallium-doped substrate as shown in FIG. 2 (e). An N-conductivity type layer is also formed in the light-receiving surface of the gallium-doped substrate as shown in FIG. 2 (f). The order of the step (e) and the step (f) is not particularly restricted, and it is also possible to perform the step (e) and the step (f) simultaneously as will be described below.

The method for diffusing a group III element in the step (e) and the method for forming an N-conductivity type layer in the step (f) are not particularly restricted. For example, it is possible to use a method to thermally diffuse the dopant. This includes a vapor phase diffusion method in which POCl$_3$ (phosphoryl chloride) or BBr$_3$ (boron tribromide) is introduced into a tube furnace with carrier gas, and diffused; a coating diffusion method in which a phosphorus or boron-containing material is applied onto a substrate, and subjected to thermal treatment. The coating method in the coating diffusion method includes spin-coating method, spray-coating method, ink-jet method, and screen printing method.

In the coating diffusion method, the group III element can be diffused by coating the backside with a material which contains a group III element followed by thermal treatment. The N-conductivity type layer can be formed by coating the light-receiving surface with a material which contains N-type dopant followed by thermal treatment. The material which contains a group III element is preferably applied to the whole area of the backside to sufficiently eliminate depletion of the P-type dopant concentration in the backside.

In this case, it is preferable to perform the step (e) and the step (f) simultaneously, i.e., to perform diffusion of a group III element and forming of an N-conductivity type layer in a thermal treatment at one time. Such a method can reduce the number of production steps when introducing a P-type layer into the backside, and can also reduce the cost without having trouble in the process. In this way, a P-type layer having a desired surface concentration can be easily introduced into the backside by performing the step (e) and the step (f) simultaneously.

When performing the step (e) and the step (f) simultaneously, a film which contains an N-type dopant is formed at first by applying a material which contains an N-type dopant onto a light-receiving surface, and introducing the substrate into a drying furnace to dry the material. Then, a film which contains a group III element is formed on the backside in a similar manner. By performing thermal treatment subsequently, it is possible to carry out the diffusion of a group III element and the formation of an N-conductivity type layer simultaneously in one thermal treatment. It is also possible to perform one of the diffusion of a group III element and the formation of an N-conductivity type layer by using the coating diffusion method, and to perform the other process by the vapor phase diffusion method.

For the material which contains N-type dopant, it is possible to use a phosphorus diffusion source (a phosphorus diffusion source), which turns to glass by thermal treatment. This phosphorus diffusion source includes any known ones, and can be obtained by mixing $P_2O_5$, pure water, polyvinyl alcohol (PVA), and tetraethyl orthosilicate (TEOS), for example.

For the material which contains a group III element, it is possible to use a boron diffusion source (a boron diffusion source), which turns to glass by thermal treatment. This boron diffusion source includes any known ones, and can be obtained by mixing $B_2O_3$, pure water, and PVA, for example.

By applying the phosphorus diffusion source onto the light-receiving surface of the substrate, and the boron diffusion source onto the backside, followed by performing the co-diffusion at a phosphorus diffusion temperature, it is possible to form a boron layer having a relatively low surface concentration since a boron atom has smaller diffusion coefficient compared to a phosphorus atom. This makes it possible to reduce the process cost compared to a method in which the boron layer and the phosphorus diffusion layer are formed separately. The phosphorus diffusion temperature is not particularly restricted, but generally in the range of 830 to 950° C. The boron diffusion temperature is generally in the range of 900 to 1100° C. These thermal treatments take generally 1 to 60 minutes, approximately.

The diffusion surface concentration and the diffusion depth of the group III element can be adjusted to an appropriate value in accordance with the purpose by regulating the content of $B_2O_3$ in a boron diffusion source, thermal diffusion temperature, and thermal diffusion time, for example.

Then, as shown in FIG. 2 (g), the PN junction is isolated by using a plasma etcher. In this process, samples are stacked so as not to prevent plasma and radical from getting into the light-receiving surface or the backside, and the side faces of the substrate are dry-etched by several microns under this stacked condition. This PN isolation by plasma etching may be performed before removing the boron glass and phosphorus glass or may be performed after the removal. It is also possible to form a trench with laser as an alternative method to the PN isolation.

After the step (e) and the step (f), not a little quantity of glass layer is formed on the surface of the substrate. The glass on the surface is removed by hydrofluoric acid, etc., as shown in FIG. 2 (h).

Subsequently, as shown in FIG. 2 (i), a dielectric film can be formed on the light-receiving surface of the gallium-doped substrate. For the dielectric film, it is possible to use the same ones described in the items of the solar cell.

Then, as shown in FIG. 2 (j), a dielectric film is formed on the backside of the gallium-doped substrate. For the dielectric film, it is possible to use the same ones described in the items of the solar cell. In the inventive method for manufacturing a solar cell, the group III element is diffused in the backside of the substrate in the step (e), which makes it possible to prevent induction of an inversion layer in the surface area of the backside of the substrate when forming a dielectric film that has positive charges such as a silicon nitride film. The steps (i) and (j) may be performed in the opposite order, and may be performed simultaneously.

Subsequently, as shown in FIG. 2 (k), the dielectric film on the contact area of a back surface electrode is just removed. The removal of the dielectric film can be performed by using a photo-lithography method, a laser ablation method, and an etching paste, for example. This etching paste contains at least one selected from the group consisting of phosphoric acid, hydrofluoric acid, ammonium fluoride, and ammonium hydrogen fluoride as an etching component together with water, organic solvent, and a viscosity agent, for example. The same structure can also be formed, without intentionally removing the dielectric film, by printing an electrode having a fire-through property, which will be described below, in the foregoing area by screen printing and so on, followed by penetrating the electrode to the dielectric film through firing.

Then, as shown in FIG. 2 (l), a paste for a back surface electrode is printed onto the backside of the gallium-doped substrate, followed by drying. For example, a paste in which Al powders are mixed with an organic binder is applied onto the backside of the substrate by screen printing. For the material for the back surface electrode, Ag and so on can also be used.

Subsequently, as shown in FIG. 2 (m), a paste for a light-receiving surface electrode is printed onto the light-receiving surface of the gallium-doped substrate, followed by drying. For example, an Ag paste in which Ag powders and glass frit are mixed with an organic binder is applied onto the light-receiving surface of the substrate by screen printing. The step (l) and the step (m) may be performed in the opposite order.

After the foregoing printing of the electrodes, the paste for a light-receiving surface electrode and the paste for a back surface electrode are fired as shown in FIG. 2 (n). In this way, the light-receiving surface electrode and the back surface electrode are formed by printing the pastes followed by firing. The firing is generally performed by thermal treatment at a temperature of 700 to 800° C. for 5 to 30 minutes. This thermal treatment makes the Ag powders penetrate to the dielectric film (fire through) on the light-receiving surface side to electrically conduct the light-receiving surface electrode and the gallium-doped substrate. It is also possible to fire back surface electrode and the light-receiving surface electrode separately.

In such a way, the solar cell shown in FIG. 1 can be manufactured. The inventive method for manufacturing a solar cell mainly features to use a gallium-doped substrate and to diffuse a group III element onto the backside before forming a dielectric film, and can be applied to various methods for manufacturing solar cells.

EXAMPLES

Hereinafter, the present invention will be specifically described by showing Examples and Comparative Example, but the present invention is not limited these Examples.

Example 1

First, as-sliced CZ substrate in a 156 mm square with the thickness of 200 μm and substrate resistivity of 1 Ω·cm was prepared for a silicon substrate uniformly doped with gallium (FIG. 2 (a)).

Then, this gallium-doped substrate was subjected to damage etching by immersing into a solution of hydrofluoric acid and nitric acid for 15 seconds (FIG. 2 (b)). This was also subjected to chemical etching for 5 minutes by using an aqueous solution with the temperature of 70° C. containing 2% of KOH and 2% of IPA (FIG. 2 (c)). Subsequently, this was cleaned with deionized water and dried to form texture structures onto the light-receiving surface of the gallium-doped substrate (FIG. 2 (d)).

Next, a boron-containing film was formed on the whole area of the backside by applying a boron diffusion source which contained boric acid onto the backside by spin-coating method, followed by drying in a drying furnace at 120° C. for about 1 minute. Then, the gallium-doped substrate having the boron-containing film formed thereon was introduced into a tube furnace, and subjected to thermal treatment at the temperature of 850° C. for the thermal treatment time of 40 minutes to diffuse the group III element to the backside of the gallium-doped substrate (FIG. 2 (e)). At this process, two pieces of the substrates were set on a slot of a quarts boat with the boron-coated surfaces facing outward so as not to grow boron-diffusion layers on the non-boron-coated faces as possible.

Subsequently, the gallium-doped substrate was subjected to thermal treatment under the atmosphere of phosphoryl chloride at 850° C. for 30 minutes to form an N-conductivity type layer in the light-receiving surface (FIG. 2 (f)). At this process, the diffusion was performed by superposing the boron-diffusion surfaces with each other, which was introduced to a slot of a quartz boat, to prevent phosphorus from diffusing into the boron-diffusion layers as possible.

Then, the PN junction was isolated by using a plasma etcher (FIG. 2 (g)). Subsequently, diffusion glass remained on the surface of the substrate was removed by immersion in a 25% aqueous hydrofluoric acid solution over 5 minutes, followed by rinsing with pure water over 5 minutes (FIG. 2 (h)).

This gallium-doped substrate subjected to diffusion was introduced into an oxidation furnace, and subjected to thermal treatment under an oxygen atmosphere at 900° C. for 30 minutes to form oxide layer with each layer thickness of 20 nm on the both surfaces of the substrate as dielectric films. On the light-receiving surface and the backside of the gallium-doped substrate, silicon nitride layers were formed respectively as dielectric films by using a plasma CVD equipment (FIGS. 2 (i) and (j)). The dielectric film on the light-receiving surface was set to have a film thickness of 90 nm. The dielectric film on the backside was also set to have a film thickness of 90 nm. At this step, the oxide films were etched with hydrofluoric acid, and the sheet resistivity was measured to be 250Ω/□. The surface concentration was assumed from this value to be about $1.5 \times 10^{18}$ atom/cm$^3$.

Subsequently, the dielectric film was removed just on the contact area for the electrodes on the backside by using an etching paste (FIG. 2 (k)).

Then, on the backside of the gallium-doped substrate, an electric conductive paste mainly composed of silver was printed by a screen-printing method, and dried at 150° C. (FIG. 2 (l)).

The electric conductive paste mainly composed of silver was also printed onto the light-receiving surface of the gallium-doped substrate by a screen-printing method, and dried at 150° C. (FIG. 2 (m)).

This substrate coated with the electric conductive paste was introduced into a firing furnace, and the electric conductive paste was fired at the maximum temperature of 800° C. for 5 seconds to form a back surface electrode and a light-receiving surface electrode to fabricate the solar cell shown in FIG. 1 (FIG. 2 (n)).

Example 2

The solar cell shown in FIG. 1 was fabricated by the same processes as in Example 1 except for processing the steps shown in (e) and (f) of FIG. 2 simultaneously. That is, in this process, a boron-containing film was formed on the whole area of the backside by applying a boron diffusing source containing boric acid onto the back surface by a spin-coating method, followed by drying on a hot plate at 120° C. for about 1 minute. Subsequently, a phosphorus-containing film was formed on the whole area of the front surface by applying a phosphorus diffusing source containing phosphoric acid by a spin-coating method, followed by drying on a hot plate at 150° C. for about 1 minute. This substrate was introduced into a tube furnace, and subjected to thermal treatment at 850° C. for 30 minutes to form an N-conductivity type layer on the front side and a P-conductivity type layer on the backside simultaneously. At this process, the diffusion was performed by superposing the boron-diffusion surfaces with each other or the phosphorus-diffusion surfaces with each other, which was introduced to a slot of a quartz boat, to prevent mutual diffusion of boron and phosphorus as possible.

Figure 3:
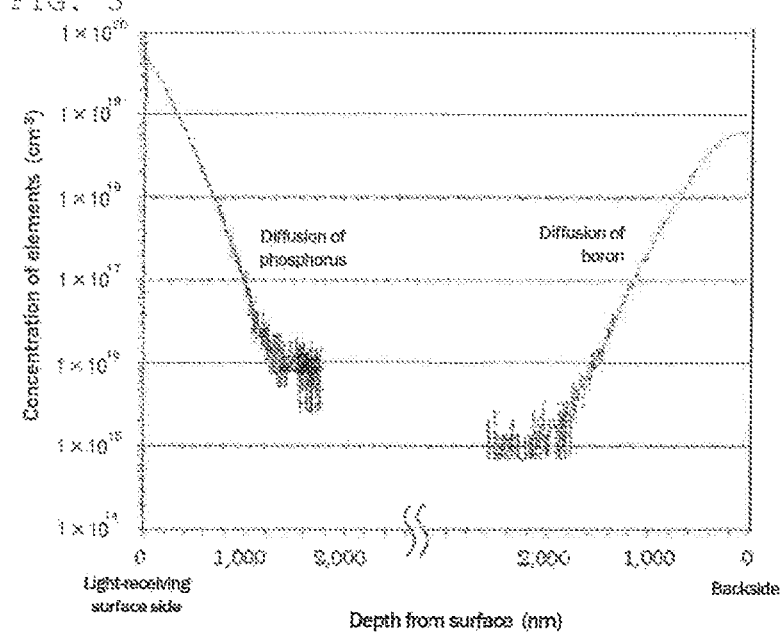
FIG. 3 is a diagram showing the diffusion profile of Example 2 by secondary ion mass spectrometry (SIMS)

The diffusion profile of Example 2 by secondary ion mass spectrometry (SIMS) is shown in FIG. 3. This was measured on the substrate after the step (h). As revealed from FIG. 3, boron was diffused in the backside, and phosphorus was diffused in the light-receiving surface of the gallium-doped substrate as had been intended.

Comparative Example

Figure 6:
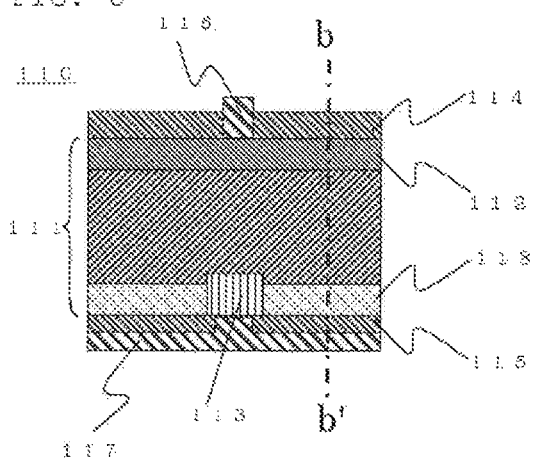
FIG. 6 is a diagram schematically showing a previous solar cell with a PERL structure.

The solar cell shown in FIG. 6 was fabricated by the same processing as in Examples except for skipping the step (e) in FIG. 2 (the step for diffusing a group III element by forming a boron-containing film on the backside of a gallium-doped substrate).

On 300 pieces of solar cells thus fabricated (Example 1: 100 pieces, Example 2: 100 pieces, Comparative Example: 100 pieces), evaluations (inspections of current-voltage characteristics) were performed with a solar simulator (in an atmosphere of 25° C., irradiation intensity: 1 kW/m$^2$, spectrum: AM 1.5 global). The results of Examples 1 and 2 and Comparative Example were shown in Table 1. The conversion efficiencies and so on in Table 1 are average values of each 100 pieces of solar cells of Examples 1 and 2 and Comparative Example.

TABLE 1

|  | Short-circuit current density | Open circuit voltage | Fill factor | Conversion efficiency |
| --- | --- | --- | --- | --- |
| Example 1 | 39.5 mA/cm$^2$ | 653 mV | 0.788 | 20.3% |
| Example 2 | 39.1 mA/cm$^2$ | 651 mV | 0.792 | 20.2% |
| Comparative Example | 37.9 mA/cm$^2$ | 651 mV | 0.766 | 18.9% |

As shown in Table 1, Examples 1 and 2, in which a group III element was diffused in the backside of each gallium-doped substrate, showed good results of the short-circuit current density, open circuit voltage, fill factor, and conversion efficiency. On the other hand, Comparative Example, in which a group III element was not diffused in the backside of the substrate, formed the inversion layer 118 in the backside of the substrate as shown in FIG. 6, and degrade the results of the short-circuit current density, etc.

Figure 4:
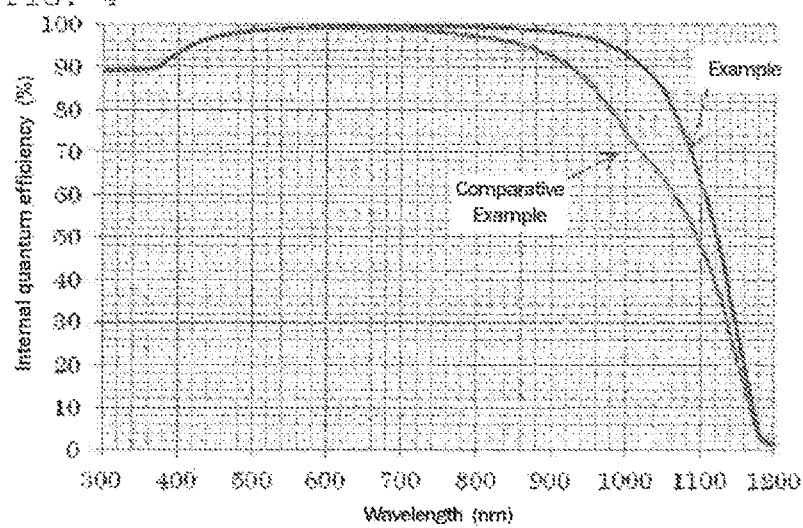
FIG. 4 is a diagram showing internal quantum efficiencies of Example 1 and Comparative Example.

The internal quantum efficiencies of Example 1 and Comparative Example are shown in FIG. 4. The internal quantum efficiencies in FIG. 4 were measured by spectral response measurement equipment. As shown in FIG. 4, Example 1 showed better internal quantum efficiencies compared to Comparative Example, particularly at wavelengths in the range of 800 nm to 1100 nm. It is to be noted that the internal quantum efficiencies in Example 2 were almost the same as the internal quantum efficiencies in Example 1.

Figure 5:
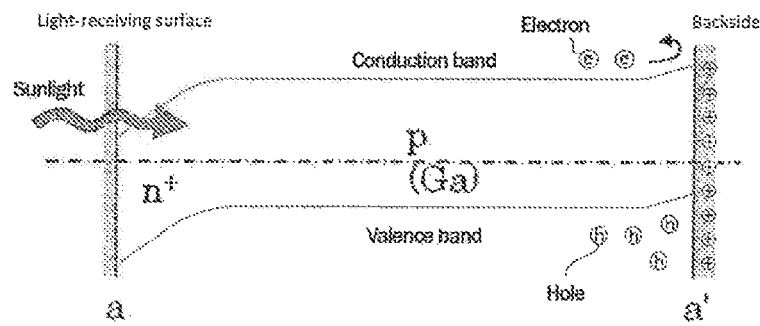
FIG. 5 is a set of diagrams conceptually showing energy band diagrams of cross sections shown by the broken lines in FIG. 1 and FIG. 6.
Figure 5:
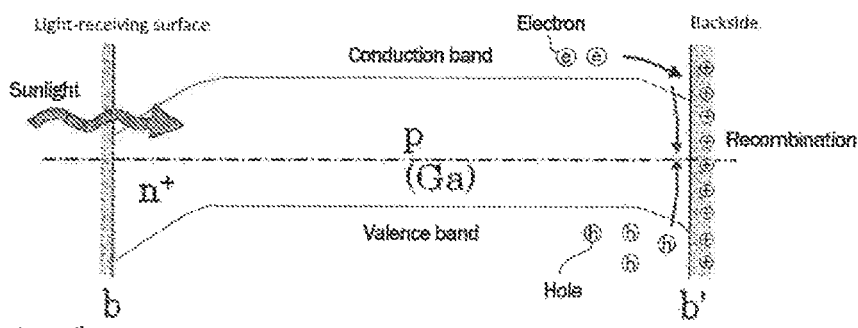

FIG. 5 is a set of diagrams conceptually showing energy band diagrams of cross sections shown by the broken lines in FIG. 1 (the structure of Examples) and FIG. 6 (the structure of Comparative Example). As shown in FIG. 5, in Examples, which had diffused a group III element, the end of the conduction band shows higher energy level at the backside compared to the bulk of the substrate since the concentration of P-type dopant was higher at the backside compared to the bulk of the substrate. This makes it possible to prevent recombination of carriers at the backside. On the other hand, in Comparative Example, which had not diffused a group III element, the end of the conduction band shows low energy level since the concentration of P-type dopant was lower at the backside compared to the bulk of the substrate. This makes carriers recombine at the backside, which drops the conversion efficiencies, etc.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A solar cell comprising:
a P-type silicon substrate in which one main surface is a light-receiving-side surface and another main surface is a backside surface;
a first dielectric layer provided on a whole area of the backside surface;
a backside electrode provided on the backside surface, the backside electrode penetrates the first dielectric layer and is electrically connected to the P-type silicon substrate;
an N-type layer in at least a part of the light-receiving-side surface;
a second dielectric layer provided on the light-receiving-side surface; and
a light-receiving-side electrode provided on the light-receiving-side surface, the light-receiving-side electrode penetrates the second dielectric layer and is electrically connected to the N-type layer,
wherein:
the P-type silicon substrate is doped with gallium,
a concentration of gallium in a region of the P-type silicon substrate contacting the first dielectric layer is lower than a concentration of gallium in a region of the P-type silicon substrate that is farther away from the first dielectric layer,
the P-type silicon substrate has a layer that includes the region contacting the first dielectric layer and that is doped with a diffused group III element over the whole area of the backside surface, which is configured to compensate the lower concentration of gallium in the region of the P-type silicon substrate contacting the first dielectric layer,
a whole area of the layer that is doped with the group III element overlays the first dielectric layer along a thickness direction of the solar cell,
and
internal quantum efficiency of the solar cell as measured by spectral response measurement equipment is greater than 90% at wavelengths in a range of 400 nm or more and 1000 nm or less.

2. The solar cell according to claim 1, wherein the internal quantum efficiency of the solar cell is greater than 60% at a wavelength of 1100 nm.

3. The solar cell according to claim 1, wherein the diffused group III element is boron.

4. The solar cell according to claim 1, wherein:
the first dielectric layer comprises a first silicon thermal oxide layer; and
the second dielectric layer comprises a second silicon thermal oxide layer.

5. The solar cell according to claim 4, wherein:
the first dielectric layer further comprises a first silicon nitride layer on the first silicon thermal oxide layer, and
the second dielectric layer further comprises a second silicon nitride layer on the second silicon thermal oxide layer.

6. A solar cell comprising:
a P-type silicon substrate in which one main surface is a light-receiving-side and another main surface is a backside surface;
a first dielectric layer provided on a whole area of the backside surface;
a backside electrode provided on the backside surface, the backside electrode penetrates the first dielectric layer and is electrically connected to the P-type silicon substrate;
an N-type layer in at least a part of the light-receiving-side surface;
a second dielectric layer provided on the light-receiving-side; and
a light-receiving-side electrode provided on the light-receiving-side surface, the light-receiving-side electrode penetrates the second dielectric layer and is electrically connected to the N-type layer;
wherein:
the P-type silicon substrate is doped with gallium,
a concentration of gallium in a region of the P-type silicon substrate contacting the first dielectric layer is lower than a concentration of gallium in a region of the P-type silicon substrate that is farther away from the first dielectric layer,
the P-type silicon substrate has a layer that includes the region contacting the first dielectric layer and that is doped with a diffused group III element over a whole area of the backside surface, which is configured to compensate the lower concentration of gallium in the region of the P-type silicon substrate contacting the first dielectric layer,
a diffusion surface concentration of the diffused group III element in the layer is $5.0 \times 10^{17}$ atom/cm$^3$ or more and $2.0 \times 10^{19}$ atom/cm$^3$ or less, the diffusion surface concentration is a concentration of the diffused group III element and does not include the concentration of gallium, a whole area of the layer that is doped with the group III element overlays the first dielectric layer along a thickness direction of the solar cell; and internal quantum efficiency of the solar cell as measured by spectral response measurement equipment is greater than 90% at wavelengths in a range of 400 nm or more and 1000 nm or less.

7. The solar cell according to claim 6, wherein the internal quantum efficiency of the solar cell is greater than 90% at wavelengths in a range of 800 nm or more and 1000 nm or less.

8. The solar cell according to claim 6, wherein the diffused group III element is boron.

9. The solar cell according to claim 6, wherein:
the first dielectric layer comprises a first silicon thermal oxide layer; and
the second dielectric layer comprises a second silicon thermal oxide layer.

10. The solar cell according to claim 9, wherein:
the first dielectric layer further comprises a first silicon nitride layer on the first silicon thermal oxide layer, and
the second dielectric layer further comprises a second silicon nitride layer on the second silicon thermal oxide layer.

11. The solar cell according to claim 1, wherein:
the solar cell has a PERL structure,
the solar cell comprises: (i) a contact area where the backside electrode is in electrical contact with the P-type silicon substrate, and (ii) a BSF layer at the contact area such that a surface of the BSF layer directly contacts the backside electrode; and
a concentration of P-type dopant at the contact area is higher than a concentration of the P-type dopant on areas at backside other than the contact area, where the P-type dopant includes gallium and the diffused group III element.

12. The solar cell according to claim 6, wherein:
the solar cell has a PERL structure,
the solar cell comprises: (i) a contact area where the backside electrode is in electrical contact with the P-type silicon substrate, and (ii) a BSF layer at the contact area such that a surface of the BSF layer directly contacts the backside electrode; and
a concentration of P-type dopant at the contact area is higher than a concentration of the P-type dopant on areas at backside other than the contact area, where the P-type dopant includes gallium and the diffused group III element.

13. The solar cell according to claim 1, wherein the solar cell has a PERC structure that does not include a BSF layer.

14. The solar cell according to claim 6, wherein the solar cell has a PERC structure that does not include a BSF layer.

* * * * *